United States Patent
Lu

(10) Patent No.: US 12,356,608 B2
(45) Date of Patent: Jul. 8, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 557 days.

(21) Appl. No.: 17/857,230

(22) Filed: Jul. 5, 2022

(65) Prior Publication Data

US 2023/0089173 A1 Mar. 23, 2023

Related U.S. Application Data

(63) Continuation of application No. PCT/CN2021/135716, filed on Dec. 6, 2021.

(30) Foreign Application Priority Data

Sep. 17, 2021 (CN) .......................... 202111095209.7

(51) Int. Cl.
H10B 12/00 (2023.01)
(52) U.S. Cl.
CPC ........... *H10B 12/34* (2023.02); *H10B 12/053* (2023.02)
(58) Field of Classification Search
None
See application file for complete search history.

(56) References Cited

U.S. PATENT DOCUMENTS

| 7,879,659 | B2 | 2/2011 | Wilson |
| 8,138,526 | B2 | 3/2012 | Wilson |
| 8,497,530 | B2 | 7/2013 | Wilson |
| 8,552,478 | B2 | 10/2013 | Wu |
| 9,219,001 | B2 | 12/2015 | Wilson |
| 9,368,388 | B2 | 6/2016 | Liaw |
| 10,068,905 | B2 | 9/2018 | Liaw |
| 2009/0026530 | A1 | 1/2009 | Wilson |
| 2011/0057269 | A1 | 3/2011 | Wilson |
| 2012/0175748 | A1 | 7/2012 | Wilson |

(Continued)

FOREIGN PATENT DOCUMENTS

| CN | 102856378 A | 1/2013 |
| CN | 103378135 A | 10/2013 |

(Continued)

*Primary Examiner* — Hsien Ming Lee
(74) *Attorney, Agent, or Firm* — Syncoda LLC; Feng Ma

(57) ABSTRACT

A manufacturing method of a semiconductor structure is provided, and the manufacturing method includes the following operations. A first trench is formed on the semiconductor substrate, in which the first trench penetrates at least two of the conductive channels of a transistor, at least part of each of the conductive channels is located at the bottom of the first trench, an oxide layer is provided between two adjacent ones of the conductive channels, and each of the conductive channels has a bump structure in the first trench relative to the oxide layer. The shape of the bump structure of each of the conductive channels at the bottom of the first trench is adjusted by etching at the bottom of the first trench, so that the bump structure has at least two protrusions. A gate structure is formed in the first trench.

15 Claims, 13 Drawing Sheets

(56) References Cited

U.S. PATENT DOCUMENTS

| | | |
|---|---|---|
| 2013/0001658 A1 | 1/2013 | Wu |
| 2013/0270652 A1 | 10/2013 | Liaw |
| 2013/0309839 A1 | 11/2013 | Wilson et al. |
| 2016/0293604 A1 | 10/2016 | Liaw |
| 2023/0048610 A1* | 2/2023 | Lu ........................ H10B 12/053 |

FOREIGN PATENT DOCUMENTS

| | | |
|---|---|---|
| CN | 103579001 A | 2/2014 |
| CN | 108717947 A | 10/2018 |
| CN | 110880508 A | 3/2020 |

\* cited by examiner

SEMICONDUCTOR STRUCTURE AND MANUFACTURING METHOD THEREOF

CROSS-REFERENCE TO RELATED APPLICATIONS

This application is a continuation application of International Application No. PCT/CN2021/135716, filed on Dec. 6, 2021, which claims priority to Chinese Patent Application No. 202111095209.7, filed on Sep. 17, 2021. The disclosures of International Application No. PCT/CN2021/135716 and Chinese Patent Application No. 202111095209.7 are hereby incorporated by reference in their entireties.

BACKGROUND

Transistors are widely used as switching devices or driving devices in electronic devices. For example, a transistor may be used in a Dynamic Random Access Memory (DRAM) for controlling a capacitor in each storage unit, and a transistor array composed of a plurality of transistors may be used in a semiconductor memory device.

In related art, when the word line (WL) of a transistor is powered on, both ends of the transistor can be conductive, and the speed of turning on the word line responds to the working efficiency of the transistor, thereby further affecting the working efficiency of the semiconductor memory device.

SUMMARY

The disclosure relates to the field of semiconductor manufacturing, and relates to but is not limited to a semiconductor structure and a manufacturing method thereof.

In view of this, the embodiment of the disclosure provides a semiconductor structure and a manufacturing method thereof.

In a first aspect, the embodiment of the disclosure provides a manufacturing method of a semiconductor structure, and the method includes the following operations.

A first trench is formed on the semiconductor substrate, in which the first trench penetrates the conductive channels of at least two of transistors, at least part of each of the conductive channel is located at a bottom of the first trench, an oxide layer is provided between two adjacent ones of the conductive channels, and each of the conductive channels in the first trench has a bump structure relative to the oxide layer.

A shape of the bump structure of each of the conductive channels at the bottom of the first trench is adjusted by etching at the bottom of the first trench, so that the bump structure has at least two protrusions.

A gate structure is formed in the first trench.

In another aspect, the embodiments of the disclosure provide a semiconductor structure, and the semiconductor structure includes: a semiconductor substrate and conductive channels of at least two of transistor.

A first trench penetrating conductive channels of at least two of the transistors is provided on the semiconductor substrate, and a gate structure is provided in the first trench.

At least part of each of the conductive channels is located at the bottom of the first trench, an oxide layer is provided between two adjacent ones of the conductive channels, and each of the conductive channels has a bump structure in the first trench relative to the oxide layer in which the bump structure has at least two protrusions.

DETAILED DESCRIPTION

In order to facilitate the understanding of the disclosure, a more complete description will be given below with reference to the relevant drawings. The preferred embodiment of the disclosure is given in the attached drawings. However, the disclosure may be implemented in many different forms and is not limited to the embodiments described herein. Rather, these embodiments are provided to make the disclosure more thorough and comprehensive.

Unless otherwise defined, all technical and scientific terms used herein have the same meanings as are commonly understood by those skilled in the art of the disclosure. Terms used herein in the specification of the disclosure are for the purpose of describing specific embodiments only, and are not intended to limit the disclosure. The term "and/or" as used herein includes any and all combinations of one or more related listed items.

Figure 1:
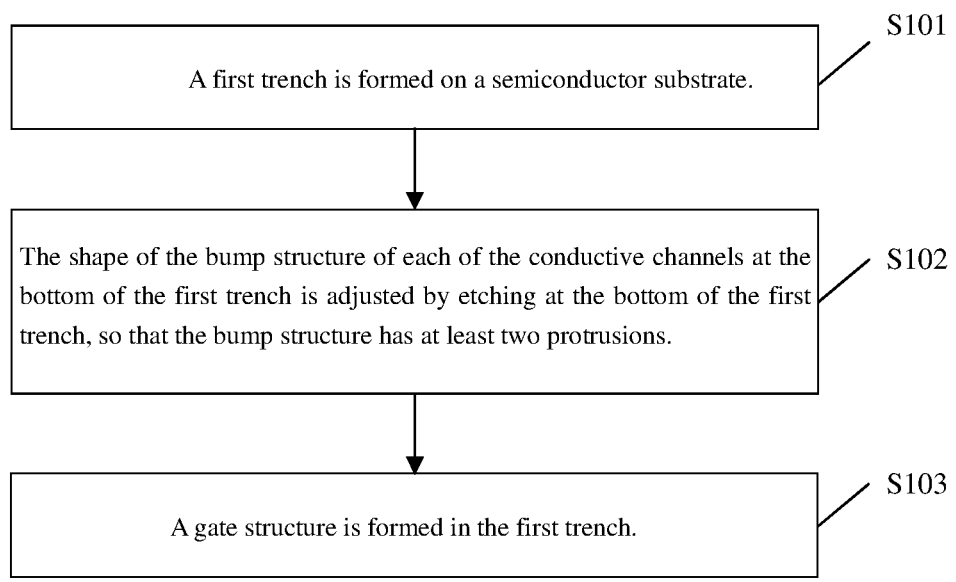
FIG. 1 is a flowchart of a manufacturing method of a semiconductor structure provided by the embodiments of the disclosure.

In the first aspect, the embodiments of the disclosure provide a manufacturing method of a semiconductor structure, as shown in FIG. 1, and the method includes the following operations.

S101, a first trench is formed on a semiconductor substrate, in which the first trench penetrates at least two of conductive channels of a transistor, at least part of each of the conductive channels is located at the bottom of the first trench, an oxide layer is provided between two adjacent ones of the conductive channels, and each of the conductive channels has a bump structure in the first trench relative to the oxide layer.

S102, the shape of the bump structure of each of the conductive channels at the bottom of the first trench is adjusted by etching at the bottom of the first trench, so that the bump structure has at least two protrusions.

S103, a gate structure is formed in the first trench.

In an embodiment of the disclosure, a first trench may be formed on a substrate surface by a patterned etching method. The first trench is used for forming a gate structure which can penetrate the entire semiconductor structure and thus can be used as a word line in the semiconductor structure. Because the gate structure is buried in the first trench instead of covering the substrate surface, this structure is also called BWL (Buried Word Line). Here, multiple first trenches may be provided and distributed in parallel on the substrate. For example, the multiple first trenches may be parallel to each other and have equal spacing, depth, and width. Therefore, multiple first trenches can be formed synchronously by etching. Of course, the first trenches can be formed by one etch or by multiple etches using a multiple exposure technique.

Figure 2A:
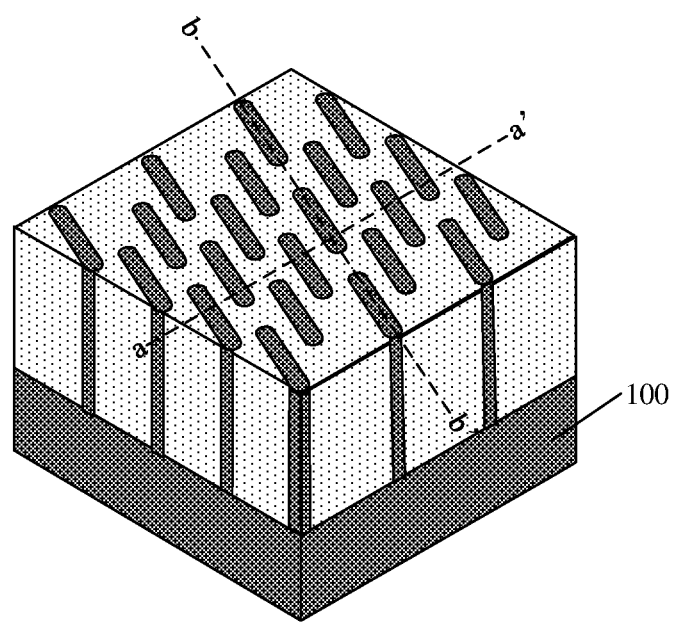
FIGS. 2A to 2C are a schematic diagram and partial cross-sectional views of a first trench formed in the manufacturing method provided by an embodiment of the disclosure.
Figure 2B:
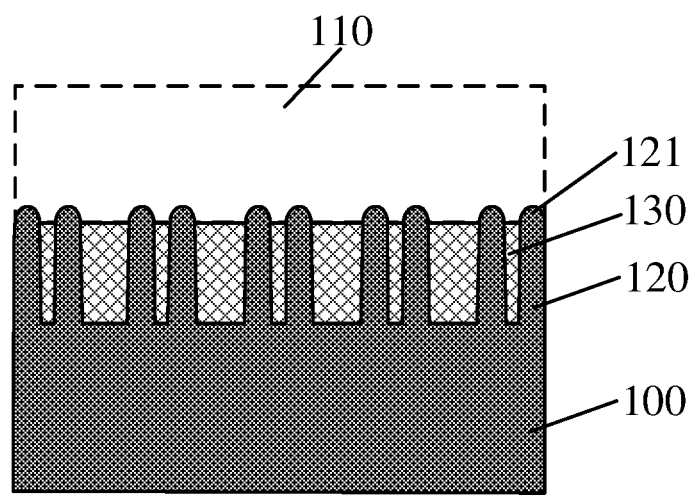
Figure 2C:
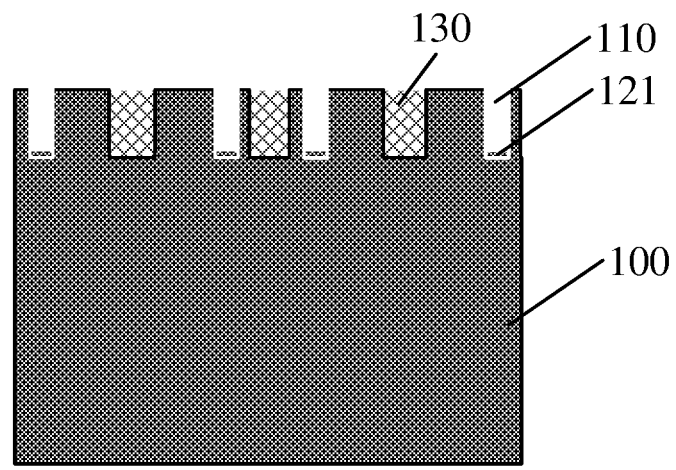

As shown in FIGS. 2A to 2C, FIG. 2B is a cross-sectional view on a section aa' in FIG. 2A and FIG. 2C is a cross-sectional view on a section bb' in FIG. 2A. In the substrate 100, a first trench 110 is formed, conductive channels 120 of at least two of transistors are provided at the bottom of the first trench 110, and the top of each of the conductive channels 120 has a bump structure 121, which may be ellipsoidal, spherical, or columnar, etc., and an oxide layer 130 is provided between the conductive channels 120, and the material of the oxide layer 130 may be silicon oxide ($SiO_2$), alumina ($Al_2O_3$) or other oxide materials. Two adjacent ones of the conductive channels 120 are spaced apart by the oxide layer 130, and the height of the conductive channels 120 is higher than the thickness of the oxide layer 130 by the height of the bump structures 121.

It should be noted that each first trench 110 penetrates the conductive channels 120 of at least two of transistors, that is, bump structures 121 on the tops of multiple conductive channels 120 are located at the bottom of the first trench 110, and in addition, the bottom of the first trench 110 also exposes the top of the oxide layer 130.

After the first trench is formed, an etching process may be performed at the bottom of the first trench to adjust the bump structure, including but not limited to plasma etching, wet etching, photolithography, etc. For example, multiple bump structures can be synchronously adjusted, and the adjustment here refers to controlling parameters such as etching rate and etching angle, so that each of the bump structures having an integral shape forms at least two protrusions with separate shape. It should be noted that the shape of each protrusion may be the same or different from the bump structure, and the shapes of the two protrusions may be the same or different.

Finally, in the embodiment of the disclosure, the gate structure covering the bump structure of the conductive channel may be formed inside the first trench by deposition, for example, chemical vapor deposition (CVD), atomic layer deposition (ALD) or physical vapor deposition (PVD), etc.

By the above method of the embodiment of the disclosure, the bump structure is adjusted by etching to form at least two protrusions, then the gate structure covers the protrusions, so that the contact area between the gate and the conductive channel can be larger, so that the flow area of the current can be increased during conducting electricity, the conductivity of the transistor is improved, and the working efficiency of the semiconductor structure is improved.

In some embodiments, the shape of the bump structure of each of the conductive channels at the bottom of the first trench is adjusted by etching at the bottom of the first trench, so that the bump structure has at least two protrusions, including the following operations.

A first insulating layer is formed at the bottom of the first trench, in which a thickness of the first insulating layer is less than or equal to a height of the bump structure relative to the oxide layer.

The bump structures and the first insulating layer are etched, to form a concave region at a center of each of the bump structures.

The oxide layer and the bump structure having the concave region are etched, to form the two protrusions.

Figure 3:
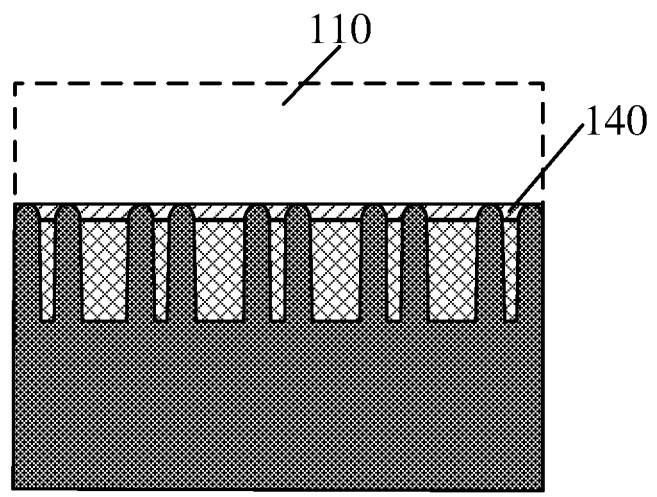
FIG. 3 is a schematic diagram of the structure after forming a first insulating layer in the manufacturing method provided by the embodiment of the disclosure.

FIG. 3 is a cross-sectional view of the structure in FIG. 2B after the first insulating layer is formed. In the embodiment of the disclosure, the first insulating layer 140 may be formed on the bottom of the first trench 110 by deposition, including but not limited to CVD, ALD or PVD or the like. It should be noted that, the height of the bump structure 121 with respect to the oxide layer 130 is the height of the bump structure 121 at the bottom of the first trench 110. The first insulating layer 140 here is configured to cover the oxide layer 130 and to space the bump structures 121 at the bottom of the first trench 110 from each other. For example, when the thickness of the first insulating layer is less than the height of the bump structure at the bottom of the first trench, the top of the bump structure is also partially exposed to the bottom of the first trench; when the thickness of the first insulating layer is equal to the height of the bump structure at the bottom of the first trench, the adjacent bump structures are completely spaced by the first insulating layer.

After the first insulating layer is formed, in the embodiments of the disclosure, the first insulating layer and the bump structures may be etched by one or more of plasma etching, wet etching, photolithography and the like, to form concave regions at the centers of the bump structures. For example, a small volume of concave spherical or ellipsoidal region is formed at the center of an ellipsoidal or spherical bump structure, so that a convex tip is formed in the peripheral region of the bump structure, thereby adjusting the shape of the bump structure.

Then, the adjusted bump structures and the oxide layer may be selectively etched by an etching method, so that the tips of the bump structures can be further adjusted to form desired shape of protrusions.

The process of forming the first insulating layer and the process of etching in the embodiments of the disclosure may be performed synchronously, which can reduce the process steps and improve the product yield.

In some embodiments, forming the first insulating layer at the bottom of the first trench includes the following operations.

An insulating material is filled in the first trench.

The insulating material is flattened to form the first insulating layer.

Figure 4:
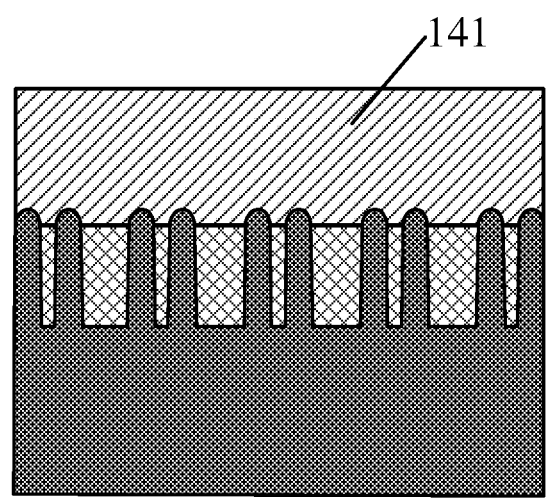
FIG. 4 is a schematic diagram of the structure after filling with an insulating material in the manufacturing method provided by the embodiment of the disclosure.

The insulating material referred to in the embodiments of the disclosure may be silicon nitride (SiN), silicon oxide, or other insulating material, as shown in FIG. 4, which is a cross-sectional view of the structure of FIG. 2B filled with the insulating material. The above-described insulating material 141 may be filled in the first trench 110 by CVD, ALD, PVD or the like, and the first insulating material 141 completely covers the top of the oxide layer 130 and the bump structure 121.

After filling the insulating material, the insulating material can be flattened by chemical mechanical polishing (CMP) to form the first insulating layer. For example, the first insulating material reacts with oxidant and catalyst in the polishing solution to form a soft layer which is relatively easy to remove. Then the soft layer is removed by the mechanical action of the abrasive in the polishing liquid and the polishing pad, so that the polished first insulating material is exposed again. The operations are repeated until the first insulating material of a predetermined thickness is removed to form the first insulating layer.

In some embodiments, etching the bump structures and the first insulating layer, to form the concave region at the center of each of the bump structures, includes etching the tops of the bump structures to form the concave regions lower than the surface of the first insulating layer.

The method further includes removing the first insulating layer.

Figure 5:
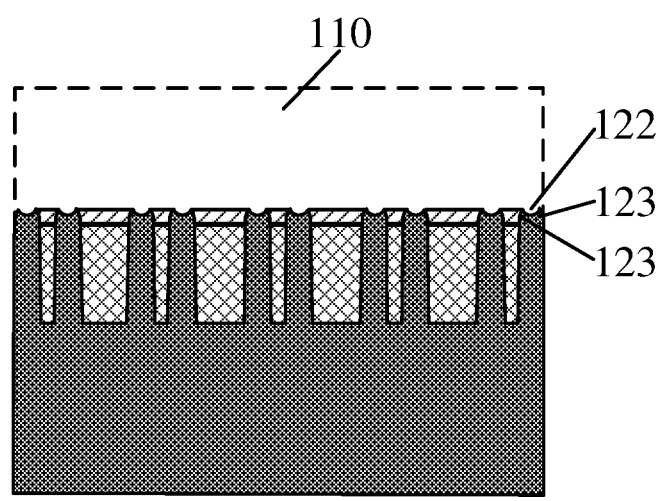
FIG. 5 is a schematic diagram of the structure after forming a concave region in the manufacturing method provided by the embodiment of the disclosure.

FIG. 5 is a cross-sectional view of the structure in FIG. 4 after forming a concave region. Etching the top of the bump structure 121 may be performed by a selective etching method, and a concave region 122 of a specific shape can be formed by controlling the etching rate, while at least two convex tips 123 are formed on both sides of the concave region 122. Since the bump structure is selectively etched, the depression formed is lower than the surface of the first insulating layer.

Figure 6:
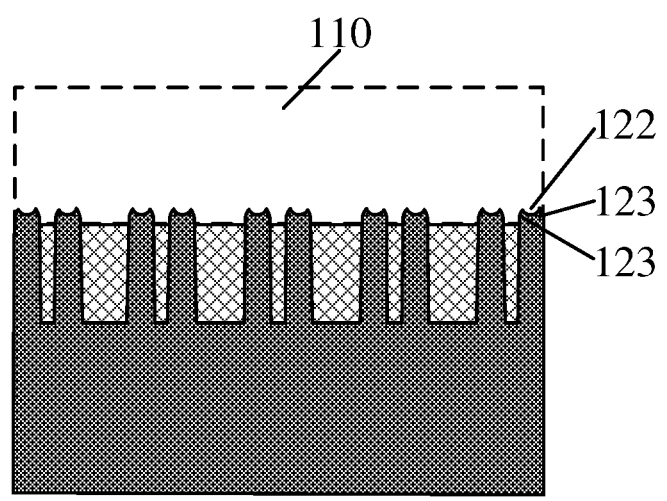
FIG. 6 is a schematic diagram of the structure after removing the first insulating layer in the manufacturing method provided by the embodiment of the disclosure.

Next, FIG. 6 is a cross-sectional view of the structure in FIG. 5 after removing the first insulating layer. The first insulating layer 140 is then removed by selective etching, to form bump structures 120 having concave regions 122 and meanwhile to expose the oxide layer 130 at the bottom of the first trench 110. It should be noted that each of bump structures 120 has formed two convex tips 123 after the previous etching.

In some embodiments, etching the oxide layer and each of the bump structures having the concave region to form the two protrusions includes the following operations.

The concave region and the oxide layer are etched synchronously at a predetermined etching rate, and two protrusions are formed on both sides of each of the bump structures adjacent to the oxide layer.

Figure 7:
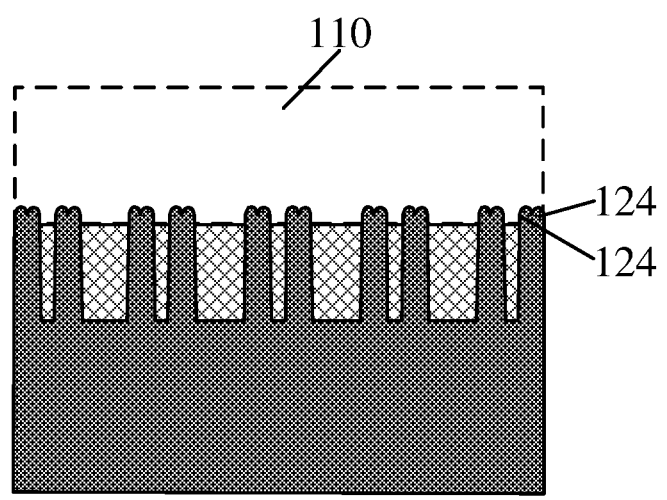
FIG. 7 is a schematic diagram of the structure after forming protrusions in the manufacturing method provided by the embodiment of the disclosure.

There may be loss in the bump structure of the conductive channel due to the previous multiple etching processes, resulting in a reduction in height, as shown in FIG. 7, which is a cross-sectional view of the structure in FIG. 6 after forming the protrusions. The oxide layer 130 can be first and synchronously etched at a predetermined etching rate, so that part of the height of the bump structure 120 is further exposed; then the two protruding tips 123 are rounded by controlling the etching rate and the etching angle, to form the two protrusions 124. Here each of the protrusions 124 is located on the side of the protruding structure 120 adjacent to the oxide layer 130.

In the embodiments of the disclosure, the protrusions are formed by adjusting the etching rate, the process is simple and easy to operate, the protrusions with larger surface area can be formed after the rounding treatment, and the contact area with the gate structure in the subsequent process can be increased.

In some embodiments, the gate structure includes a gate oxide layer and a gate conductive layer. Forming the gate structure in the first trench includes the following operations.

The gate oxide layer covering the bump structure is formed in the first trench.

The gate conductive layer is formed in the first trench covered with the gate oxide layer.

The gate oxide layer in the embodiments of the disclosure may be formed by oxidizing the surface of the bump structure, and the gate oxide layer covers the outer surface of the bump structure and is connected with the oxide layer on both sides of the bump structure for electrically isolating the conductive channel from the subsequently formed gate conductive layer.

After forming the gate oxide layer, the gate conductive layer may be formed on the gate oxide layer in the first trench by a deposition method such as CVD, ALD or PVD, and the material of the gate conductive layer may be a metal, a semiconductor or other conductive material, etc. For example, the gate conductive layers may be formed synchronously, and may have equal depth and width within the first trench.

The gate structure in the embodiment of the disclosure is buried in the first trench and covers at least two protrusions on the protruding structure, thereby increasing the contact area between the conductive channel and the gate structure and improving the conductivity of the semiconductor structure.

In some embodiments, the gate conductive layer includes a first conductive layer and a second conductive layer. Forming the gate conductive layer in the first trench covered with the gate oxide layer includes the following operations.

The bottom of the first trench covered with the gate oxide layer is covered with a first conductive material, to form the first conductive layer.

A second conductive material is filled in the first trench covered with the first conductive material, to form the second conductive layer.

Figure 8:
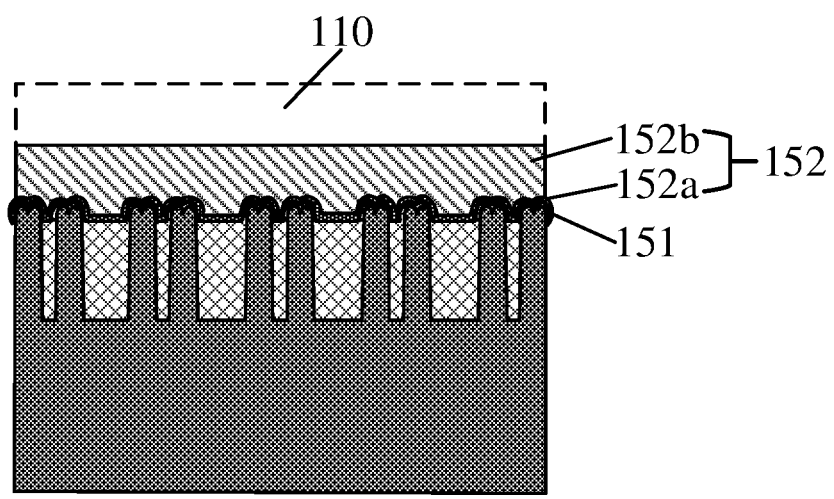
FIG. 8 is a schematic diagram of the structure after forming a gate structure in the manufacturing method provided by the embodiment of the disclosure.

In the embodiment of the disclosure, as shown in FIG. 8 which is a cross-sectional view of the structure in FIG. 7 after forming the gate structure is shown, the gate structure 150 may be divided into the gate oxide 151 and the gate conductive layer 152, and the gate conductive layer 152 may be divided into the first conductive layer 152a and the second conductive layer 152b. The first conductive layer 152a covers the gate oxide layer 151, the second conductive layer 152b covers the first conductive layer 152a, and the thickness of the second conductive layer 152b may be greater than that of the first conductive layer 152a.

For example, the bottom of the first trench covered with the gate oxide layer may be covered with a first conductive material by a deposition method, in which the first conductive material may be a stable and conductive compound, such as titanium nitride (TiN). Titanium nitride has good chemical stability, high thermal shock resistance and electrical conductivity. Next, a second conductive material may be filled in the first trench covering with the first conductive material by a deposition method, in which the second conductive material may be a metal, such as tungsten (W), nickel (Ni), molybdenum (Mo) or the like.

In the embodiment of the disclosure, the compound with better chemical stability and higher conductivity covering the gate oxide layer forms the first conductive layer, and metal covering the first conductive layer forms the second conductive layer, and the first conductive layer and the second conductive layer constitute the gate conductive layer. In this way, the conductivity of the semiconductor structure can be improved, the loss of conductive channel can be reduced, and the yield of product can be improved.

In some embodiments, the thickness of the gate structure is less than the depth of the first trench. After forming the gate structure within the first trench, the method further includes: filling a dielectric material in the first trench covered with the second conductive material to form an isolation layer.

Figure 9:
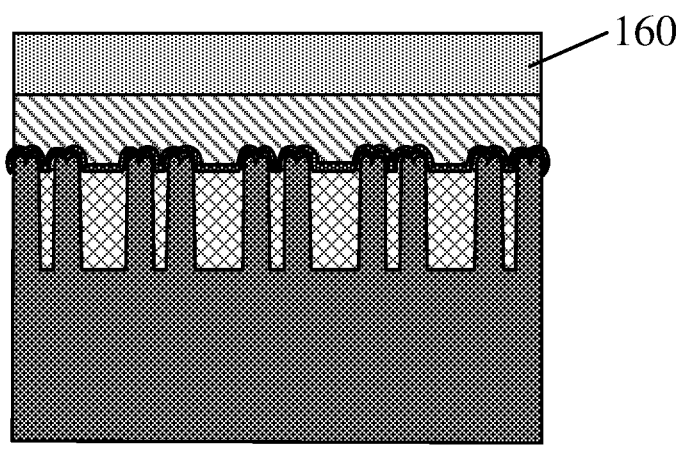
FIG. 9 is a schematic diagram of the structure after forming an isolation layer in the manufacturing method provided by the embodiment of the disclosure.

As shown in FIG. 9, which is a cross-sectional view of the structure in FIG. 8 after forming the isolation layer, after the gate structure 150 is formed, when the thickness of the gate structure 150 is less than the depth of the first trench 110, the first trench 110 may be filled by depositing the dielectric material, thereby forming the isolation layer 160. The dielectric material herein may include but is not limited to silicon nitride, silicon oxynitride (SiON) or other dielectric materials. For example, the first isolation layer 160 may be formed synchronously within multiple first trenches 110 and have equal depth and width.

In some embodiments, prior to forming the first trench on the semiconductor substrate, the method further includes the following operations.

A second trench is formed on the semiconductor substrate.

An oxide is filled in the second trench to form an oxide layer between the adjacent conductive channels.

In the embodiment of the disclosure, a second trench may be formed on the surface of a substrate by a patterned etching method, and the second trench is configured for forming the oxide layer. Herein, a conductive channel of the semiconductor structure is formed between each adjacent two of the second trenches. For example, there may be multiple second trenches, which are distributed in parallel in the substrate. The multiple second trenches may be parallel to each other and have equal spacing, depth, and width. Therefore, multiple second trenches can be formed synchronously by etching. Of course, the second trenches can be formed by one etching or by multiple etchings using a multiple exposure technique.

After forming the second trenches, an oxide, such as silicon oxide, alumina or other oxide material, may be filled in the second trenches by CVD, ALD, PVD or the like. The thickness of the oxide layer formed after filling the oxide is less than the height of the conductive channel, and the conductive channel has a bump structure relative to the oxide layer. Here, the oxide layer electrically isolates each adjacent two of the conductive channels.

In some embodiments, forming a second trench on the semiconductor substrate includes the following operations.

A mask is placed on the conductive channel region of the transistor.

The semiconductor substrate outside the region of the mask is etched, to form the second trench.

In the embodiment of the disclosure, a patterned mask may be placed on a region where a conductive channel of a transistor needs to be formed, and the mask is used to protect the semiconductor substrate in the region of the mask from being etched in the subsequent etching process. Next, the etching operation, such as plasma etching, wet etching or photolithography, is performed in the semiconductor substrate outside the region of the mask. The etching processes may be performed synchronously, and the depth of the second trenches can be controlled, by controlling the etching time. Finally, multiple second trenches can be formed in the semiconductor substrate.

Figure 10A:
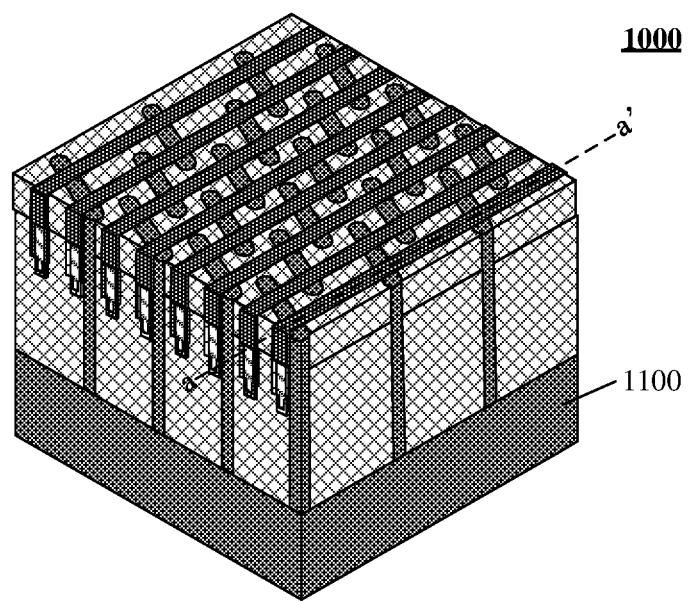
FIGS. 10A and 10B are schematic diagrams of a semiconductor structure provided by the embodiments of the disclosure.
Figure 10B:
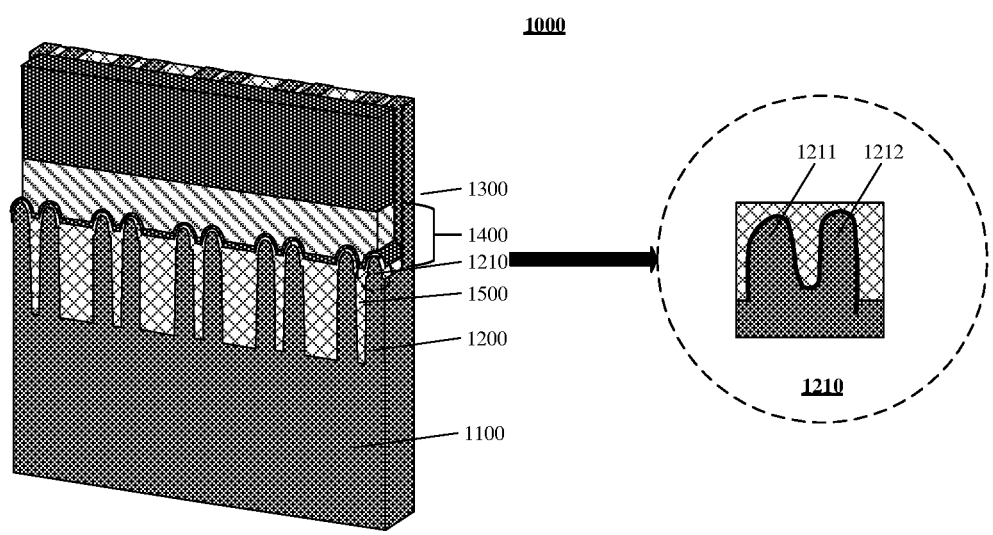

FIG. 10A and FIG. 10B are shown, in which FIG. 10B is a schematic diagram on the aa' section in FIG. 10A, the embodiments of the disclosure also provide a semiconductor structure 1000, the semiconductor structure 1000 includes a semiconductor substrate 1100 and conductive channels 1200 of at least two of transistors.

The A first trench 1300 penetrating conductive channels 1200 of at least two of the transistor is provided on the semiconductor substrate 1100, and a gate structure 1400 is provided in the first trench 1300.

At least part of each of the conductive channels 1200 is located at the bottom of the first trench 1300, an oxide layer 1500 is provided between two adjacent ones of the conductive channels 1200, and each of the conductive channels 1200 has a bump structure 1210 relative to the oxide layer 1500 within the first trench 1300, in which the bump structure 1210 has at least two protrusions 1211 and 1212.

In the embodiment of the disclosure, the semiconductor substrate may be a silicon substrate, and the conductive channels on the semiconductor substrate are spaced from the oxide layer, and each adjacent two of the conductive channels are electrically isolated by the oxide layer. The height of the conductive channels is greater than the thickness of the oxide layer, so that each of the conductive channels has a bump structure relative to the oxide layer. In addition, the first trench is located above the conductive channels and the oxide layer, the bump structure is located at the bottom of the conductive channel, the top of the oxide layer is exposed in the first trench, and the gate structure in the first trench covers the bump structures and the oxide layer.

The bump structure of the embodiments of the disclosure further includes at least two protrusions. The contact area between the two protrusions and the gate structure is larger than the contact area between the single bump structure of the same shape and the gate structure. Therefore, the flow of current can be realized through the two protrusions, and the flow area can be increased, thereby improving the conductivity of the transistor and improving the working efficiency of the semiconductor structure.

In some embodiments, at least two of the protrusions are located on both sides of the protrusions adjacent to the oxide layer.

In an embodiment of the disclosure, at least two protrusions may be formed synchronously and have the same height, width or shape. Therefore, at least two protrusions on the same bump structure can be connected to each other and are located on both sides of the bump structure adjacent to the oxide layer. For example, the bump structure can have two ellipsoidal protrusions, the two protrusions are connected with each other by a "valley", and two protrusions on the sides opposite to the "valley" are respectively connected with oxide layer on both sides of the conductive channel In some embodiments, the gate structure includes: a gate oxide layer located in the first trench and covering the bump structure; and a gate conductive layer located in the first trench and covering the gate oxide layer.

In an embodiment of the disclosure, the gate oxide layer may be composed of an oxide, such as silicon oxide, alumina, or other oxide materials, and the gate oxide layer is located at the bottom of the first trench, covers the bump structures and is connected with the above-mentioned oxide layer, to electrically isolate the bump structures from the gate conductive layer. The gate conductive layer may be composed of a conductive material, such as a metal, semiconductor, or other conductive material, and the gate conductive layer may be configured to provide a word line voltage, so that the word line is turned on or off.

In some embodiments, the gate conductive layer includes first conductive layer and a second conductive layer.

The first conductive layer is located in the first trench covered with the gate oxide layer and covers the bottom of the first trench.

The second conductive layer is located in the first trench and covers the first conductive layer.

The gate conductive layer in an embodiment of the disclosure may be composed of two different conductive materials, in which the first conductive layer may be composed of a conductive compound, such as titanium nitride, which has good chemical stability and high conductivity, and the second conductive layer may be formed of a metallic material such as tungsten, nickel, molybdenum or the like, which is a common material for forming word line and has low cost and good electrical conductivity. Here, the first conductive layer covers the gate oxide layer and the oxide layer, the second conductive layer covers the first conductive layer, and the thickness of the first conductive layer may be less than that of the second conductive layer.

In some embodiments, the thickness of the gate structure is less than the depth of the first trench. The semiconductor structure also includes an isolation layer located in the first trench and covering the second conductive layer.

In the embodiments of the disclosure, the isolation layer may be composed of a dielectric material, such as silicon nitride, silicon oxynitride or other dielectric materials. The isolation layer is located on the gate structure in the first trench, in particular, on the second conductive layer of the gate structure.

It should be noted that, the features disclosed in the embodiments of several methods or devices provided in this disclosure can be arbitrarily combined without conflict, to obtain a new method embodiment or device embodiment.

The above-mentioned is only specific embodiments of the disclosure, but the scope of protection of the disclosure is not limited thereto. Any skilled person familiar with the technical field can easily think of changes or substitutions within the technical scope of the disclosure, and should be covered within the scope of protection of the disclosure. Therefore, the scope of protection of this disclosure shall be subject to the scope of protection of the claims.

INDUSTRIAL APPLICATION

The embodiments of the disclosure provide a semiconductor structure and a manufacturing method thereof. In the method, a bump structure at the bottom of a first trench is etched, to make the bump structure have at least two protrusions, and a gate structure covers the bump structure. In this way, the contact area between the conductive channel and the gate structure can be increased, thus increasing the current flow area, improving the conductivity of the transistor and improving the working efficiency of the semiconductor structure.

The invention claimed is:

1. A manufacturing method of a semiconductor structure, comprising:
    forming a first trench on a semiconductor substrate, wherein the first trench penetrates conductive channels of at least two of transistors, at least part of each of the conductive channels is located at a bottom of the first trench, an oxide layer is arranged between two adjacent ones of the conductive channels, and each of the conductive channels has a bump structure in the first trench relative to the oxide layer;
    adjusting a shape of the bump structure of each of the conductive channels at the bottom of the first trench by etching at the bottom of the first trench so that the bump structure has at least two protrusions; and
    forming a gate structure in the first trench.

2. The manufacturing method according to claim 1, wherein adjusting the shape of the bump structure of each of the conductive channels at the bottom of the first trench by etching at the bottom of the first trench so that the bump structure has at least two protrusions, comprising:
    forming a first insulating layer at the bottom of the first trench, wherein a thickness of the first insulating layer is less than or equal to a height of the bump structure relative to the oxide layer;
    etching the bump structure and the first insulating layer to form a concave region at a center of the bump structure; and
    etching the oxide layer and the bump structure having the concave region, to form the two protrusions.

3. The manufacturing method according to claim 2, wherein forming the first insulating layer at the bottom of the first trench comprises:
    filling an insulating material in the first trench; and
    planarizing the insulating material to form the first insulating layer.

4. The manufacturing method according to claim 2, wherein etching the bump structure and the first insulating layer to form the concave region at the center of the bump structure comprises:
    etching a top of the bump structure, to form the concave region lower than a surface of the first insulating layer; and
    wherein the method further comprises removing the first insulating layer.

5. The manufacturing method according to claim 2, wherein etching the oxide layer and the bump structure having the concave region to form the two protrusions, comprises:
    etching the concave region and the oxide layer synchronously at an etching rate, to form the two protrusions on two sides of the bump structure adjacent to the oxide layer.

6. The manufacturing method according to claim 1, wherein the gate structure comprises a gate oxide layer and a gate conductive layer, and forming the gate structure in the first trench comprises:
    forming the gate oxide layer covering the bump structure in the first trench; and
    forming the gate conductive layer in the first trench covered with the gate oxide layer.

7. The manufacturing method according to claim 6, wherein the gate conductive layer comprises a first conductive layer and a second conductive layer, and forming the gate conductive layer in the first trench covered with the gate oxide layer comprises:
    covering the bottom of the first trench, which is covered with the gate oxide layer, with a first conductive material to form the first conductive layer; and
    filling a second conductive material in the first trench, which is covered with the first conductive material, to form the second conductive layer.

8. The manufacturing method according to claim 7, wherein a thickness of the gate structure is less than a depth of the first trench, and after forming the gate structure in the first trench, the method further comprises:
    filling the first trench, which is covered with the second conductive material, with a dielectric material to form an isolation layer.

9. The manufacturing method according to claim 1, wherein, prior to forming the first trench on the semiconductor substrate, the method further comprises:
    forming a second trench on the semiconductor substrate; and
    filling an oxide in the second trench to form the oxide layer between two adjacent ones of the conductive channels.

10. The manufacturing method according to claim 9, wherein forming the second trench on the semiconductor substrate comprises:
    placing a mask on a region of the conductive channels of the transistors; and etching the semiconductor substrate outside a region of the mask to form the second trench.

11. A semiconductor structure comprising:

a semiconductor substrate, wherein a first trench penetrating conductive channels of at least two of transistors is provided on the semiconductor substrate, and a gate structure is provided in the first trench; and the conductive channels of at least two of the transistors, wherein at least part of each of the conductive channels is located at a bottom of the first trench, an oxide layer is provided between two adjacent ones of the conductive channels, and each of the conductive channels has a bump structure in the first trench relative to the oxide layer, wherein the bump structure has at least two protrusions.

12. The semiconductor structure according to claim 11, wherein at least two of the protrusions are located on two sides of the bump structure adjacent to the oxide layer.

13. The semiconductor structure according to claim 11, wherein the gate structure comprises:

a gate oxide layer located in the first trench and covering the bump structures; and a gate conductive layer located in the first trench and covering the gate oxide layer.

14. The semiconductor structure according to claim 13, wherein the gate conductive layer comprises:

a first conductive layer located in the first trench covered with the gate oxide layer and covering the bottom of the first trench; and a second conductive layer located in the first trench and covering the first conductive layer.

15. The semiconductor structure according to claim 14, wherein a thickness of the gate structure is less than a depth of the first trench, and the semiconductor structure further comprises an isolation layer located in the first trench and covering the second conductive layer.

\* \* \* \* \*